United States Patent
Nuebling et al.

(10) Patent No.: US 12,009,807 B2
(45) Date of Patent: Jun. 11, 2024

(54) SLEW RATE CONTROL FOR FAST SWITCHING OUTPUT STAGES

(71) Applicant: Infineon Technologies AG, Neubiberg (DE)

(72) Inventors: Marcus Nuebling, Olching-Esting (DE); Carmelo Giunta, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/651,158

(22) Filed: Feb. 15, 2022

(65) Prior Publication Data

US 2023/0261645 A1    Aug. 17, 2023

(51) Int. Cl.
*H03K 17/04* (2006.01)
*H03K 17/0812* (2006.01)

(52) U.S. Cl.
CPC ... *H03K 17/0406* (2013.01); *H03K 17/08128* (2013.01); *H03F 2203/45248* (2013.01)

(58) Field of Classification Search
CPC .......... H03K 17/0406; H03K 17/08128; H03F 2203/45248
See application file for complete search history.

(56) References Cited

U.S. PATENT DOCUMENTS

| | | | | |
|---|---|---|---|---|
| 6,535,039 B2* | 3/2003 | Nanba | ................... | H03K 5/2481 327/170 |
| 7,173,801 B2* | 2/2007 | Belverde | .......... | H03K 17/08128 361/93.1 |
| 7,548,117 B2* | 6/2009 | Zhang | ................. | H03F 3/45179 330/255 |
| 7,710,200 B2* | 5/2010 | Cho | ........................ | H03F 3/301 330/264 |
| 2011/0133782 A1* | 6/2011 | Czech | ............ | H03K 19/018585 327/54 |

(Continued)

OTHER PUBLICATIONS

"30 A Isolated SiC Gate Driver with Slew Rate Control and SPI", Preliminary Technical Data ADuM4177, Analog Devices, Accessed from: https://www.analog.com/media/en/technical-documentation/data-sheets/adum4177.pdf, Received on: Nov. 19, 2021, 32 pp.

(Continued)

*Primary Examiner* — Metasebia T Retebo
*Assistant Examiner* — James G Yeaman
(74) *Attorney, Agent, or Firm* — Shumaker & Sieffert, P.A.

(57) ABSTRACT

A drive circuit configured to apply a slew rate controlled drive signal to the control terminal of a power transistor. The drive circuit may be part of a system that includes one or more sub-circuits in which each sub-circuit includes a regulation loop, a matched replica of the power transistor and regulated voltage node. The voltage reference voltage for each sub-circuit connects to the control terminal of the power switch through a buffer circuit to apply a sequence of voltages to the control terminal of the power switch. A switching controller circuit may manage the operation of the one or more sub-circuits so that the drive circuit may output a precisely controlled voltage profile to the control terminal of the power transistor. The circuit may include a second buffer under the control of the switching controller circuit to further manage the operation of the power transistor.

18 Claims, 6 Drawing Sheets

(56) References Cited

U.S. PATENT DOCUMENTS

2015/0022258 A1\* 1/2015 Sadate ................. H03K 17/163
                                                              327/398
2022/0028453 A1\* 1/2022 Yuh .................... G11C 13/0038

OTHER PUBLICATIONS

Miyazaki et al., "General-Purpose Clocked Gate Driver IC With Programmable 63-Level Drivability to Optimize Overshoot and Energy Loss in Switching by a Simulated Annealing Algorithm", IEEE, vol. 53, No. 3, May-Jun. 2017, pp. 2350-2357.

\* cited by examiner

SLEW RATE CONTROL FOR FAST SWITCHING OUTPUT STAGES

TECHNICAL FIELD

The disclosure relates to driver circuits for power switches.

BACKGROUND

Power transistors in output stages to drive loads, such as motors, provide higher efficiency when operated at higher switching frequencies when compared to lower switching frequencies. However, higher switching frequencies may also cause other circuit challenges such as electromagnetic interference (EMI).

SUMMARY

In general, the disclosure describes a drive circuit that outputs a slew rate controlled drive signal to the control terminal of a power transistor in order to provide fast switching frequencies and to improve circuit efficiency while avoiding byproducts of fast switching including electromagnetic interference (EMI) and overvoltage caused by stray inductance. The drive circuit for the power transistor may include one or more sub-circuits in which each sub-circuit includes a regulation loop, a matched replica of the power transistor and regulated voltage node. The regulated node serves as a reference voltage. The voltage from the regulated node connects to the control terminal of the power switch through a separate buffer circuit for each sub-circuit to apply an accurate and precise voltage to the control terminal of the power switch in a short time (e.g., on the order of a few nanoseconds). A switching controller circuit may manage the operation of the one or more sub-circuits so that the drive circuit may output a precisely controlled voltage profile to the control terminal of the power transistor.

In one example, this disclosure describes a circuit configured to drive a control terminal of a power semiconductor comprises a replica semiconductor comprising a replica of the power semiconductor, a regulation loop configured to set and maintain a first voltage at a regulated node, wherein the regulation loop comprises the replica semiconductor, a first buffer configured to apply the first voltage from the regulated node to the control terminal of the power semiconductor while the first buffer is switched ON, and a second buffer configured to apply a second voltage to the control terminal while the first buffer is switched OFF.

In another example, this disclosure describes a system comprising: a power transistor that includes a control terminal, a circuit configured to drive operation of the power transistor, the circuit comprising: a replica transistor configured as a replica of the power transistor, a regulation loop configured to set and maintain a first voltage at a regulated node, wherein the regulation loop comprises the transistor, a first buffer configured to apply the first voltage from the regulated node to the control terminal of the power transistor while the first buffer is switched ON, and a second buffer configured to apply a second voltage to the control terminal while the first buffer is switched OFF, and control circuitry configured to manage the operation of the system.

In another example, this disclosure describes a method comprises regulating a first voltage at a reference node of a circuit, wherein the circuit is configured to drive operation of a power transistor, wherein the power transistor comprises a control terminal, wherein a regulation loop of the circuit is configured set and maintain the first voltage at the reference node, and wherein the regulation loop comprises a transistor configured as a replica of the power transistor, controlling, by switching control circuitry, the operation of a first buffer with a first enable signal connected to the first buffer, wherein the first buffer connects the reference node to the control terminal of the power transistor when the first buffer is enabled, controlling, by the switching control circuitry, the operation of a second buffer with a second enable signal connected to the second buffer. The second buffer connects a second voltage to the control terminal of the power transistor when the second buffer is enabled. In response to receiving the first enable signal at the first buffer, the switching control circuitry may apply the voltage of the reference node to the control terminal of the power transistor.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1:
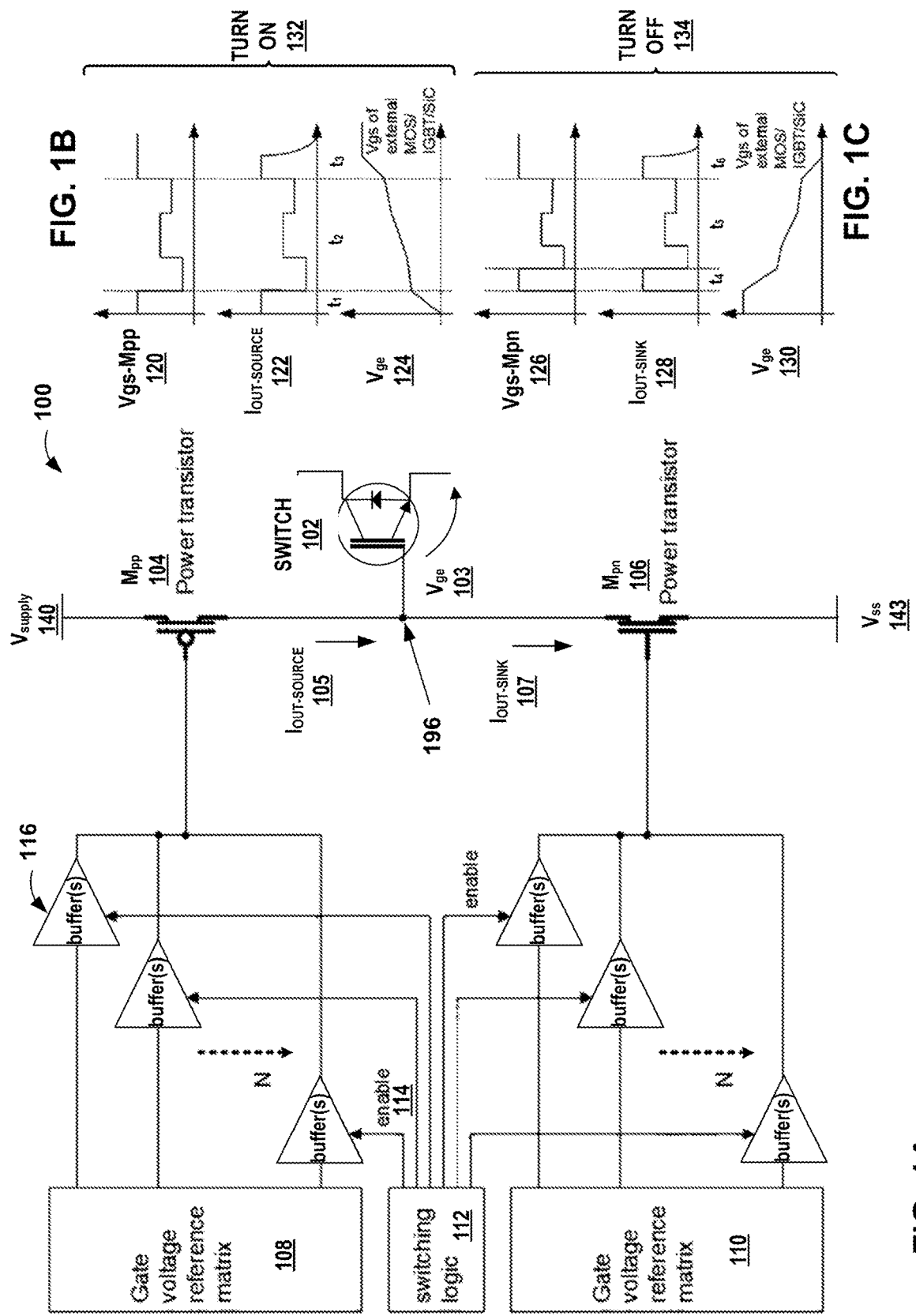
FIG. 1A is a block diagram illustrating a system configured to apply a gate-profile waveform to a power transistor for slew rate control of the power transistor.
FIGS. 1B and 1C are timing graphs illustrating the turn on and turn off profiles, respectively for the power semiconductors.

This disclosure describes a drive circuit configured to apply a slew rate controlled drive signal to the control terminal of a power transistor. The drive circuit may be part of a system that includes one or more sub-circuits in which each of the sub-circuits includes a regulation loop, a matched replica of the power transistor and regulated voltage node. The regulated node serves as a reference voltage. The regulated node for each of the sub-circuits connects to the control terminal of the power switch through a buffer circuit to apply a sequence of voltages to the control terminal of the power switch in a short time (e.g., on the order of a few nanoseconds). Each subcircuit used to control the voltage profile may include a buffer circuit that connects to the control terminal. A switching controller circuit may manage the operation of the one or more sub-circuits so that the drive circuit may output a precisely controlled voltage profile to the control terminal of the power transistor. In some examples, the circuit may also include a second buffer under the control of the switching controller circuit to further manage the operation of the power transistor.

The circuit and system of this disclosure may be customized to a variety of power switches by configuring the switching controller and the selected regulated voltages for each sub-circuit to a particular application. The circuit and system of this disclosure may also provide one or more advantages over other types of gate profile driver circuits. For example, the circuit of this disclosure may operate within tight performance limits over a range of operating conditions and is relatively insensitive to manufacturing process variation. For example, the circuit of this disclosure may be useful to control an electric motor or other similar load, which may be in a vehicle, such as an automobile, and may operate in temperature conditions from T=−50° C. to +175° C. or higher. In contrast, other types of gate driver circuits, such as circuits that include multiple parallel drivers that may be switched to adjust the gate drive signal, may be subject to a wide range of RDS-ON variation based on changes in operating condition and from process variation, with a resulting performance inaccuracy.

FIG. 1A is a block diagram illustrating a system configured to apply a gate-profile waveform to a power transistor for slew rate control of the power transistor. In the example of FIG. 1A, system 100 includes gate reference voltage matrices 108 and 110, where each gate reference voltage matrix connects to a control terminal of a power transistor through several buffers 116. Each of buffers 116 may be controlled by switching logic 112. Though shown as a single buffer, each buffer of buffers 116 may be implemented as, for example two, three or more buffer stages, e.g., connected in series. In some examples, each buffer stage may be separately controlled by switching logic 112.

Switching logic 112 is control circuitry that may output an enable signal, e.g., enable signal 114 that may enable or disable each respective buffer of buffers 116. In other words, switching logic 112 may enable, or switch ON a buffer as well as disable or switch OFF the buffer. Switching logic 112 is configured to generate a voltage profile, e.g., Vgs-Mpp 120 in FIG. 1B and Vgs-Mpn 126 in FIG. 1C, to control each power transistor Mpp 104 and Mpn 104 by alternately enabling and disabling individual buffers of buffers 116.

In the example of FIG. 1A, power transistor Mpp 104, is a depicted as a PMOS power metal oxide semiconductor field effect transistor (MOSFET) with the drain-source channel that connects between Vsupply 140 and output 196. Output 196 may also be referred to as switching node 196. Power transistor Mpn 106 is depicted as a NMOS power MOSFET with the drain-source channel that connects output 196 a reference voltage, Vss 143. In some examples, Vss 143 may be considered a circuit ground.

Output 196 connects to a control terminal of switch 102, which in the example of FIG. 1A is the gate of an insulated gate bipolar junction transistor (IGBT). In other examples, power transistors Mpp 104, Mpn 106 and switch 102 may be implemented using other types of switches, e.g., bipolar junction transistors, and similar switches. The switches of this disclosure may be implemented with silicon carbide (SiC), gallium-nitride (GaN) and other materials and technologies.

In operation, system 100 may turn ON switch 102 by outputting a slew rate controlled drive signal to the gate of Mpp 104 (132). For example, at t1, switching logic 112 may control circuitry of gate voltage reference matrix 108 to a first voltage, followed by a voltage profile during t2 and t3, as shown by Vgs-Mpp 120. As a result, the current through Mpp 104, e.g., Iout-source 105 may have a current profile as shown in graph Iout-source 122. The result is a controlled increase in Vge 103 as shown by graph Vge 124.

Similarly, to turn OFF switch 102 (134), switching logic 112 and gate voltage reference matrix 110 may output a similar voltage profile to the gate of Mpn 106, as shown by Vgs-Mpn 126. The voltage profile at t4, t5 and t6 results in Iout-sink 107 with a current profile shown by graph Iout-sink 128 and a controlled decrease in Vge 103 as shown by graph Vge 130. Such as slew rate controlled gate profile during operation may provide the benefit of fast switching frequencies, e.g., circuit efficiency, while avoiding byproducts of fast switching including EMI and overvoltage caused by stray inductance.

FIG. 2A is a schematic diagram illustrating one example implementation of a system configured to apply a gate-profile waveform to a power transistor. System 200 is an example of system 100 described above in relation to FIG. 1A and may have the same or similar functions and characteristics. System 200 shows an example circuit arrangement of a portion of gate voltage reference matrix 108 and gate voltage reference matrix 110 depicted in FIG. 1A.

System 200 includes a circuit configured to drive the control terminal of power semiconductor Mpp 204, which is depicted as a power MOSFET in the example of FIG. 2A. The drive circuit includes an output buffer, including a first buffer 216 and a second buffer 255 that apply voltages to the gate of Mpp 204 under the control of switching logic 212, similar to buffer 116 described above in relation to FIG. 1A. The first buffer 216 is configured to apply a first voltage from a regulated node 230 to the gate of power semiconductor Mpp 204 while buffer 216 is switched ON, e.g., enabled by switching logic 212.

The second buffer 255 is a depicted as a CMOS inverter in the example of FIG. 2A, and configured to apply a second voltage to the gate of Mpp 204 while buffer 216 is switched OFF. In the example of FIG. 2A, buffer 255 includes PMOS transistor P0 250 which connects Vsupply 240 through the drain-source channel of P0 250 to the drain-source channel of NMOS transistor M0 252, which in turn connects to reference node Vss 243. Switching logic 212 connects to both gates of P0 250 and M0 255 with the same control signal line. Buffer 255 applies supply voltage 240 to the gate of Mpp 204. In other examples, buffer 255 may (a) be implemented with a different circuit arrangement than a CMOS inverter and (b) may couple a different voltage node other than Vsupply 240 to the gate of Mpp 204.

In the example shown in FIG. 2A, the drive circuit for Mpp 204 further includes regulation loop 257, which is configured to set and maintain a predetermined voltage at regulated node 230. Regulation loop 257 includes replica semiconductor Mpr 292, which is a replica of power transistor Mpp 204. In this disclosure replica transistor Mpr 292 is therefore the same type of transistor as PMOS transistor Mpp 204. Also replica transistor Mpr 292 and the power transistor Mpp 204 were fabricated on a same substrate under same conditions and replica transistor Mpr 292 has a replica area that is proportional to an area of the power transistor Mpp 204. Thus, replica transistor Mpr 292 may perform in a very similar manner to power transistor Mpp 204. In some examples the size of replica transistor Mpr 292 may be proportional to but 100×, 800×, 1000×, or some similar value smaller than power transistor Mpp 204.

Regulation loop 257 includes several circuit elements including impedance Z1 260, impedance Z2 262, current source I$_{trimmed}$ 242, transistors M1 231, M2 232 and an operational amplifier (opamp) 268 configured as an error amplifier. Impedance Z1 260 connects to supply voltage, Vsupply 240 in parallel to impedance Z2 262, and impedance Z1 260 matches impedance Z2 262. In other words, the value, e.g., the impedance of impedance Z1 260 equals the value of impedance Z2 262 within manufacturing and measurement tolerances. In some examples, impedance Z2 262 and impedance Z1 260 may be implemented by one or more resistors, by one or more diodes, by one or more transistors, e.g., by diode connected transistors, or by any combination of circuit components to form matching impedances.

Z1 260 connects between Vsupply 240 and current source I$_{trimmed}$ 242, which in turn connects to a reference voltage Vss 243, which may be considered the circuit ground, in some examples. Impedance Z2 262 connects Vsupply 240 to the drain-source channel of NMOS transistor M2 232. The non-inverting input of error amplifier 268 connects to the node between Z1 260 and current source I$_{trimmed}$ 242, while the inverting input of error amplifier 268 connects to the node between Z2 262 and M2 232. The output of error amplifier 268 is regulated node 230. Regulated node 230 is a difference between the node between Z1 260 and current source I$_{trimmed}$ 242 and node between Z2 262 and M2 232. In other words, the voltage at regulated node 230 is the value to have a difference of zero between the node between Z1 260 and current source I$_{trimmed}$ 242 and node between Z2 262 and M2 232.

The drain-source channel of replica transistor Mpr 292 connects Vsupply 240 to the drain source channel of NMOS transistor M1 231, which in turn connects to reference node Vss 243. The drain of M1 231 connects to the gate of M1 231, which creates a current mirror with M2 232, and causes I1 to match I2, within manufacturing and measurement tolerances.

The value of the regulated voltage at node 230 may be based on the selected magnitude of electric current set for I$_{trimmed}$ 242. Regulation loop 257 may be relatively slow, when compared to the switching speed of Mpp 204, Mpn 206 and switch 202, which may be on the order of a few nanoseconds. However, regulation loop 257 may provide a precise and accurate voltage at node 230 that has very little variation caused by changes in manufacturing processes, operating voltage and operating temperature, e.g., on the order of less than five percent. The circuit arrangement with buffer 216 and buffer 255 means that system 200 may apply the voltages to the gate of Mpp 204 for circuits operating with a switching speed of less than about 30 nanoseconds, for 130 mm technology integrated circuits to less than five nanoseconds for other technology with smaller spacing. Also, as described above in relation to FIG. 1A, when multiple driver circuits are part of a gate voltage switching matrix, e.g., matrix 108, then system 200 may generate a very precise and accurate gate voltage profile that is stable and reliable over a wide range of operating conditions.

System 200 also includes a circuit configured to drive the control terminal of power semiconductor Mpn 206, which is depicted as an NMOS power MOSFET in the example of FIG. 2A. The drive circuit includes an output buffer, including a first buffer 218 and a second buffer 256 that apply voltages to the gate of Mpn 206 under the control of switching logic 212, similar to buffers 116 and gate voltage switching matrix 110 described above in relation to FIG. 1A. The first buffer 218 is configured to apply a first voltage from regulated node 235 to the gate of power semiconductor Mpn 206 while buffer 218 is switched ON, i.e., is enabled by switching logic 212.

The second buffer 256 is depicted as a CMOS inverter in the example of FIG. 2A, and configured to apply a second voltage to the gate of Mpn 206 while buffer 218 is switched OFF. In the example of FIG. 2A, buffer 256 includes PMOS transistor P1 251 which connects Vsupply 241 through the drain-source channel of P1 251 to the drain-source channel of NMOS transistor M1 253, which in turn connects to reference node Vss 245. Switching logic 212 connects to both gates of P1 251 and M1 253 with the same control signal line. Buffer 256 applies supply voltage 241 to the gate of Mpn 206. As described above for the Mpp 204 drive circuit, in other examples, buffer 256 may (a) be implemented with a different circuit arrangement than a CMOS inverter and (b) may couple a different voltage node other than Vsupply 241 to the gate of Mpn 206. In some examples, Vsupply 240 may be approximately the same as Vsupply 241. In other examples Vsupply 241 may be set to a different voltage than Vsupply 240.

The drive circuit for Mpn 206 further includes regulation loop 259, which is configured to set and maintain a predetermined voltage at regulated node 235. Regulation loop 259 includes replica semiconductor Mnr 294, which is a replica of power transistor Mpn 206. As with Mpr 292 and Mpp 204, replica transistor Mnr 294 may perform in a very similar manner to power transistor Mnp 206.

Regulation loop 259 includes several circuit elements including impedance Z3 264, impedance Z4 266, current source I$_{trimmed}$ 244, transistors P4 234, P3 233 and an opamp 270, which is configured as an error amplifier. Impedance Z3 264 connects to reference voltage, Vss 245 in parallel to impedance Z4 266, and impedance Z3 264 matches impedance Z4 266. In other words, the value, e.g., the impedance of impedance Z3 264 equals the value of impedance Z4 266 within manufacturing and measurement tolerances. Similar to Z1 260 and Z2 262 described above, in some examples, impedance Z3 264 and impedance Z4 266 may be implemented by one or more resistors, by one or more diodes, by one or more transistors, e.g., by diode connected transistors, or by any combination of circuit components to form matching impedances. In some examples, the node for Vss 245 is connected to the node for Vss 243, e.g., to the same circuit ground.

Current source I$_{trimmed}$ 244 connects between Vsupply 241 and impedance Z3 264, which in turn connects to a reference voltage node Vss 245. The drain-source channel of NMOS transistor P4 234 connects Vsupply 241 rail to Z4 264. The non-inverting input of error amplifier 270 connects to the node between Z3 264 and current source Itrimmed 244, while the inverting input of error amplifier 268 connects to the node between Z4 266 and P4 234. The output of error amplifier 270 is regulated node 235. Regulated node 235 is a difference between the node between Z3 264 and current source Itrimmed 244 and node between Z4 266 and P4 234. In other words, similar to regulated node 230, the voltage at regulated node 235 is the value to have a difference of zero between the node between Z3 264 and current source Itrimmed 244 and node between Z4 266 and P4 234.

The drain-source channel of replica transistor Mnr 294 connects Vss 245 to the drain source channel of PMOS transistor P3 233, which in turn connects to supply voltage Vsupply 241. The drain of P3 233 connects to the gate of P3 233, which creates a current mirror with P4 234, and causes the drain-sources currents for each transistor to match, within manufacturing and measurement tolerances.

Similar to system 100 described above in relation to FIG. 1A, in operation, system 100 may turn ON switch 202 by outputting a slew rate controlled drive signal to the gate of Mpp 204. For example, at t1, switching logic 212 may control CMOS inverter 255 to couple Vsupply 240 to the gate of Mpp 204. By first bringing the gate of Mpp 204 to Vsupply 240, system 200 may overcome any parasitic capacitance on the gate of Mpp 204 and so cause faster switch transitions to the start of period t2. As described above in relation to FIG. 1A, switching logic 212 may apply any number of different voltages to the gate of Mpp 204 during period t2 to generate a gate voltage profile configured to deliver the desired performance for Mpp 204. As shown by Vgs-Mpp 280 in FIG. 2B, switching logic 212 may enable buffer 255 when buffer 216 (or other buffers 116 coupled to switching matrix 108 depicted in FIG. 1A) is switched OFF. As a result, the current through Mpp 204, e.g., Iout-source 205 may have a current profile as shown in graph Iout-source 282. The result is a controlled increase in Vge 203 as shown by graph Vge 284.

Similarly, to turn OFF switch 202, switching logic 212 may output a similar voltage profile to the gate of Mpn 206, as shown by Vgs-Mpn 286 in FIG. 2C. As with buffer 255 for Mpp 204, switching logic 212 may couple the gate of Mpn 206 to Vsupply 204 at t4 to allow for faster switch transitions to the start of period t5. At t6, switching logic 212 may again couple Vsupply 241 to the gate of Mpn 206 when buffer 218, or other buffers 116 shown in FIG. 1A, are switched OFF. The voltage profile at t4, t5 and t6 results in Iout-sink 207 with a current profile shown by graph Iout-sink 288 and a controlled decrease in Vge 203 as shown by graph Vge 290.

Figure 3:
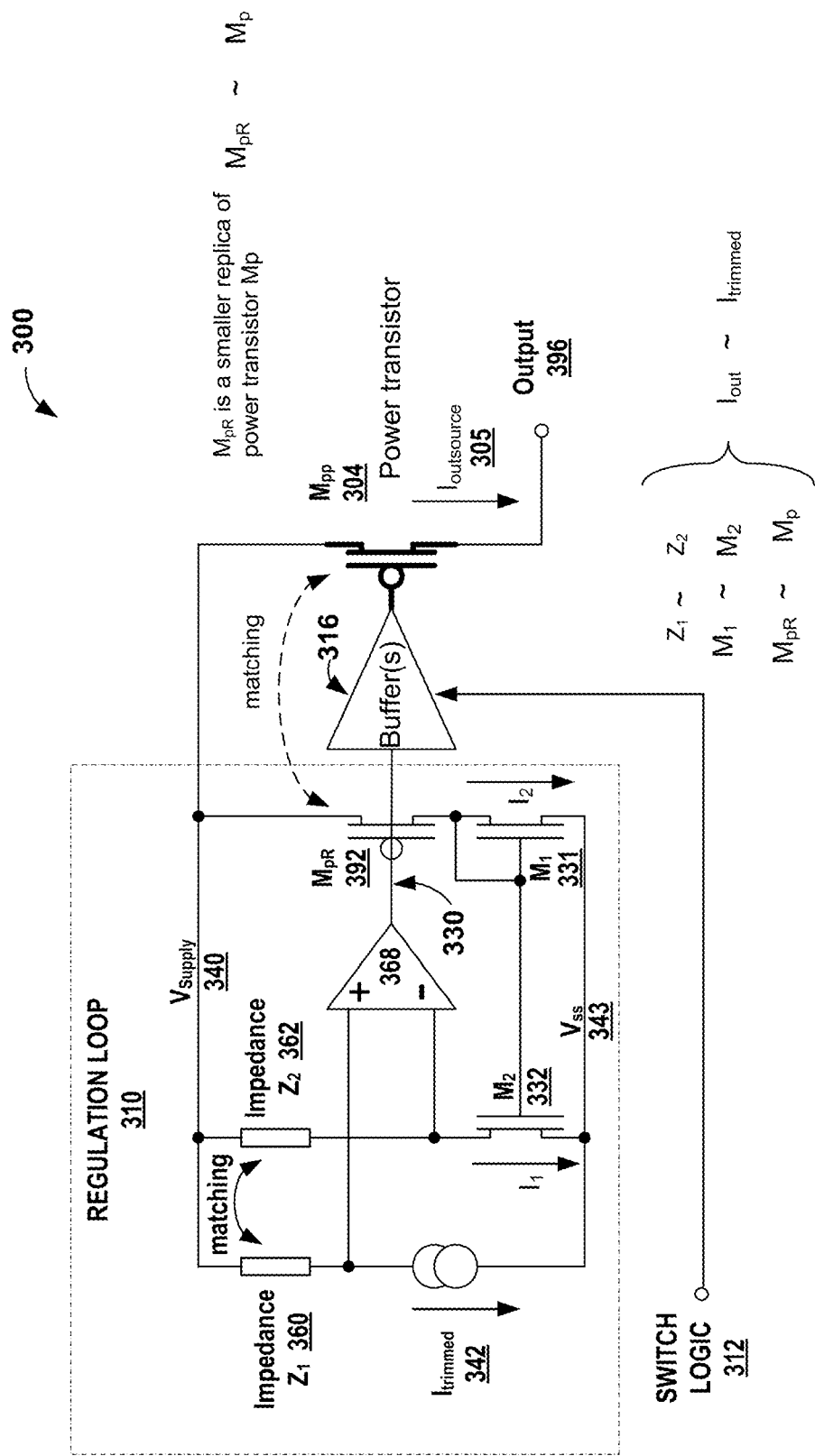
FIG. 3 is a schematic diagram illustrating an example implementation of a circuit with a regulated voltage node, the circuit for use in a system for slew rate control of a power transistor.

FIG. 3 is a schematic diagram illustrating an example implementation of a circuit with a regulated voltage node, the circuit for use in a system for slew rate control of a power transistor. Circuit 300 is an example of a sub-circuit in gate voltage reference matrix 108 configured to drive a PMOS power transistor Mpp 304 according to one or more techniques of this disclosure.

As described above in relation to FIGS. 1 and 2, the drive circuit includes loop 310 configured to set and maintain a predetermined voltage at a regulated node 330 as well as one or more buffers 316, which may also be referred to as buffer stages. Buffer 316 is controlled by an enable signal from switch logic 312 and is buffer configured to apply the voltage from regulated node 330 to the control terminal of Mpp 304 while buffer 316 is switched ON. Regulation loop 310 includes replica semiconductor Mpr 392, which is a smaller replica of power semiconductor Mpp 304. In other words Mpr 392 is proportional to Mpp 304.

Similarly, transistor M2 332 matches transistor M1 331 and impedance Z1 360 matches impedance Z2 362. As described above in relation to FIG. 2A, impedance Z1 360 connects between Vsupply 340 rail and current source, Itrimmed 342, which in turn connects to a reference voltage Vss 343. Impedance Z2 362 connects Vsupply 340 to the drain-source channel of NMOS transistor M2 332. The non-inverting input of error amplifier 368 connects to the node between Z1 360 and current source Itrimmed 342, while the inverting input of error amplifier 368 connects to the node between Z2 362 and M2 332. The output of error amplifier 368 is regulated node 330. In this manner, the voltage at regulated node 330 is a difference between the node between Z1 360 and current source Itrimmed 342 and node between Z2 362 and M2 332. In other words, similar to regulated node 230 of FIG. 2, the voltage at regulated node 330 is the value to have a difference of zero between the node between Z1 360 and current source Itrimmed 342 and node between Z2 362 and M2 332.

The drain-source channel of replica transistor Mpr 392 connects Vsupply 340 rail to the drain source channel of NMOS transistor M1 331, which in turn connects to reference node Vss 343. The drain of M1 331 connects to the gate of M1 331, which creates a current mirror with M2 332, and causes I1 to match I2, within manufacturing and measurement tolerances. The result is output current, Iout-source 305 is proportional to Itrimmed 342 at output 396.

As with any physical circuit, the various structural components may have some small differences and, for example I1 may equal I2 only to within a few decimal places. As described above in relation to FIG. 2A, the circuit arrangement of circuit 300, with replica transistor Mpr 392 in the regulation loop, may allow for a precise and accurate predetermined voltage at regulated node 330. The circuit operation may remain stable, e.g., with five percent of expected operating parameters, through a wide range of operating conditions because the matching components, e.g., both Z1 360 and Z2 362, both M1 331 and M2 332 and both Mpp 304 and Mpr 392 will vary approximately the same for temperature, voltage and other changes in operating conditions. Also, part-to-part variation may also remain stable, because changes small variations in the manufacturing process for example, small differences in doping, dimensions and similar variations cause by e.g., lot to lot, machine to machine, and location to location differences will be consistent for the matching components on the same integrated circuit.

Figure 4:
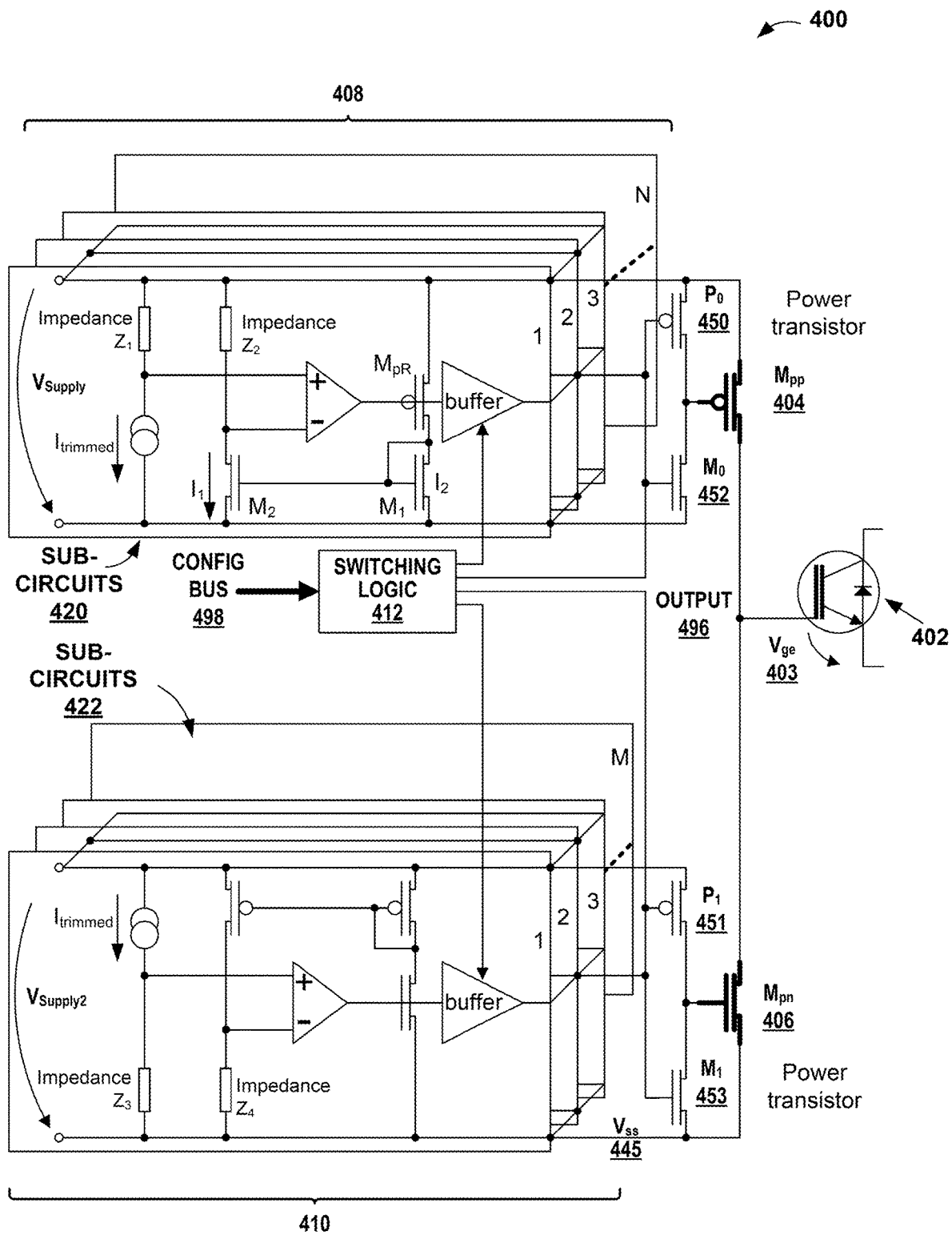
FIG. 4 is a schematic and block diagram illustrating an example system with a plurality of circuits configured to apply a gate-profile waveform to operate one or more power transistors.

FIG. 4 is a schematic and block diagram illustrating an example system with a plurality of circuits configured to apply a gate-profile waveform to operate one or more power transistors. System 400 is an example of systems 100 and 200 described above in relation to FIGS. 1 and 2 respectively and has the same or similar functions and characteristics.

In the example of FIG. 4, system 400 includes gate reference voltage matrices 408 and 410. Gate reference voltage matrix 408 includes driver sub-circuits 420, e.g., sub-circuit 1, 2, 3 through N. Gate reference voltage matrix 410 includes driver sub-circuits 422, e.g., sub-circuits 1, 2, 3 through M. In some examples, gate reference voltage matrix 408 includes the same number of driver sub-circuits 420 as gate reference voltage matrix 410, e.g., M may equal N. In other examples, each gate reference voltage matrix may include a different number of driver sub-circuits.

Each of driver sub-circuits 420 is an example of circuit 300, described above in relation to FIG. 3 and of the driver circuit for Mpp 204, described above in relation to FIG. 2A. Each of driver sub-circuits 422 is an example of the driver circuit for Mpn 206, described above in relation to FIG. 2A. The driver sub-circuits of FIG. 4 may have the same or similar arrangement, matching components, characteristics and functions as described for the driver circuits of FIGS. 1-3.

In the example of FIG. 4, each of driver sub-circuits 420 includes a first buffer that connects to the control terminal of Mpp 404 through a single CMOS inverter stage, that includes P0 450 and M0 452, which is an example of buffer 255 described above in relation to FIG. 2A. In other examples (not shown in FIG. 4), each of subcircuits 420 may connect to the gate of Mpp 404 with a separate, respective output buffer stage.

Similarly, sub-circuits 410 may all connect to CMOS inverter stage with P1 451 and M1 453 as shown in FIG. 4, or in other examples, each sub-circuit may have a separate, respective output buffer stage.

Each of buffers of sub-circuits 420 and 422, as well as the CMOS inverter buffer stage with P0 450 and M0 452, and CMOS inverter stage with P1 451 and M1 453 may be separately controlled by switching logic 412. Switching logic 412 is control circuitry that may output an enable signal that may enable or disable each respective buffer of system 400. As described above in relation to FIGS. 1 and 2, switching logic 412 is configured to generate a voltage profile at the gate of each power transistor Mpp 404 and Mpn 406 by alternately enabling and disabling the individual buffers. The arrangement of sub-circuits 420 and 422, along with the CMOS output buffers, may result in applying a precise voltage at the reference node of each sub-circuit to the gate of the power transistor in a short amount of time to generate the voltage profile, e.g., as described above in relation to FIG. 1A for Vgs-Mpp 120 and Vgs-Mpn 126. In the example of FIG. 4, switching logic 412 may be configured based on configuration bus 498.

Figure 2:
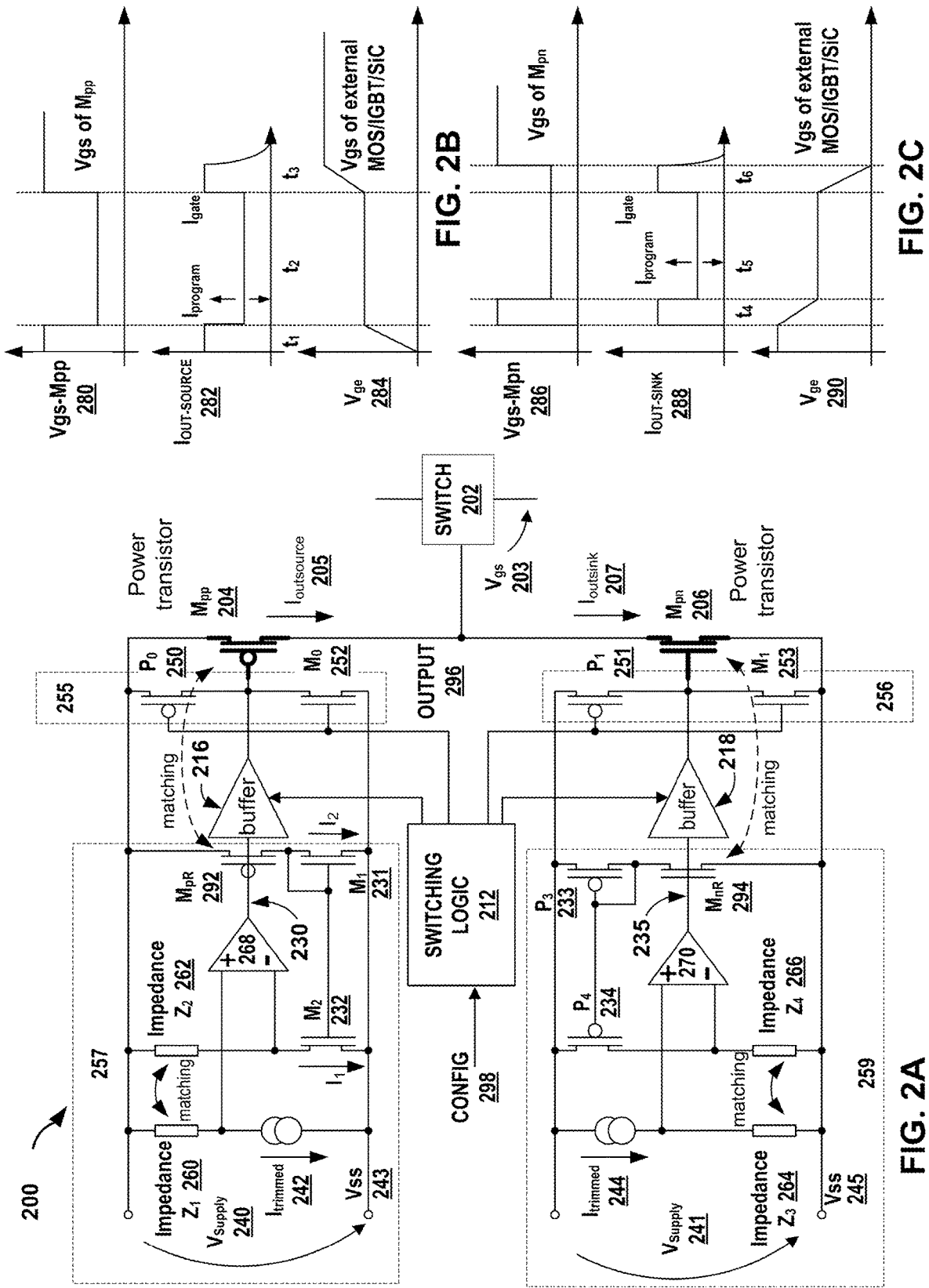
FIG. 2A is a schematic diagram illustrating one example implementation of a system configured to apply a gate-profile waveform to a power transistor.
FIGS. 2B and 2C are timing graphs illustrating the turn on and turn off profiles, respectively for the power semiconductors.

Similar to FIGS. 1-3, power transistor Mpp 404, is a depicted as a PMOS power MOSFET with the drain-source channel that connects between Vsupply 140 and output 496. Power transistor Mpn 406 is depicted as a NMOS power MOSFET with the drain-source channel that connects output 496 a reference voltage, Vss 445. Output 496 connects to the gate of switch 402 to provide a slew rate controlled output for Vge 403.

Figure 5:
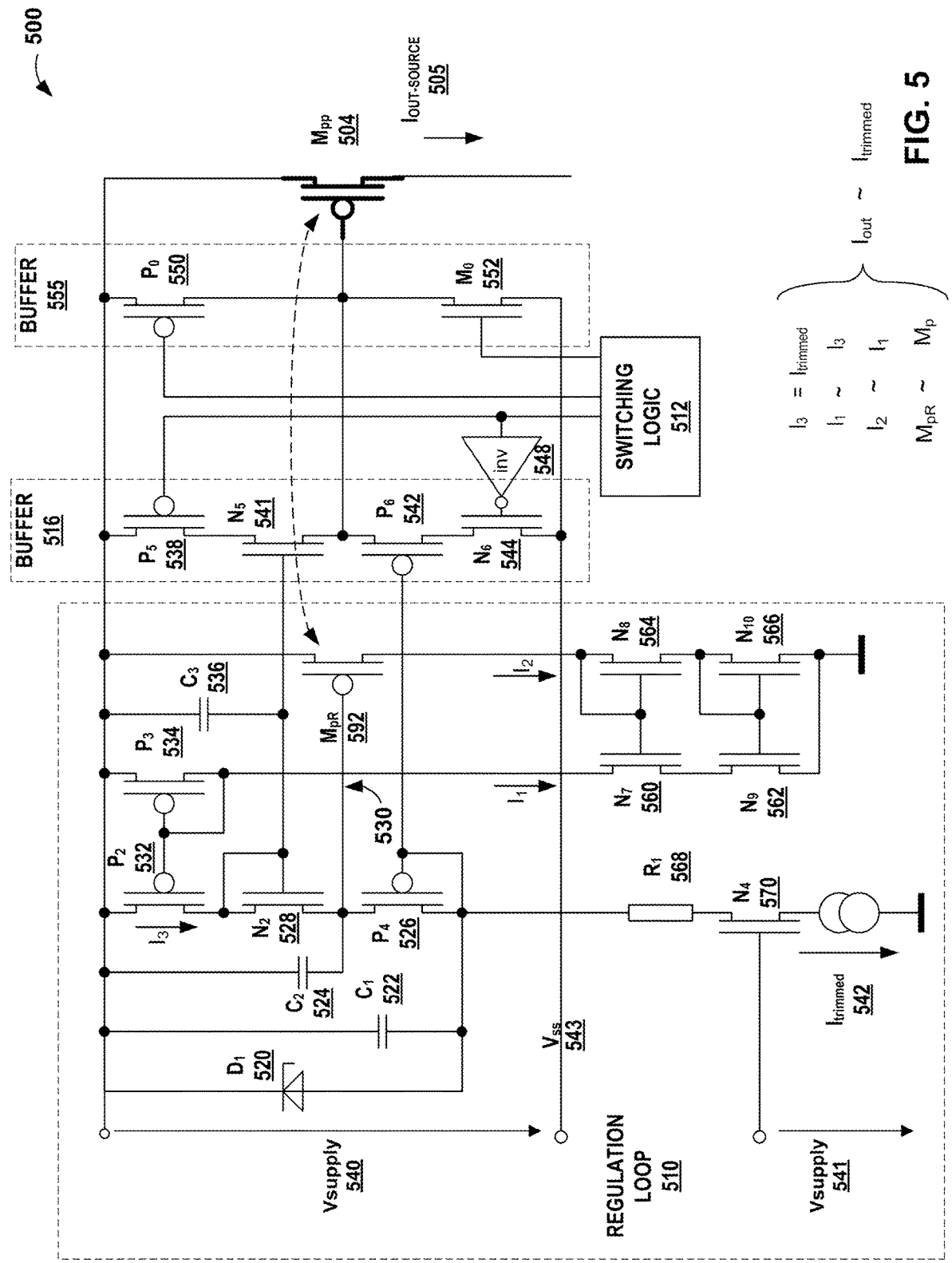
FIG. 5 is a schematic diagram of an example implementation of circuit with compact buffer and regulation loop for slew rate control of a power transistor.

FIG. 5 is a schematic diagram of an example implementation of circuit with compact buffer and regulation loop for slew rate control of a power transistor. System 500 is an example of systems depicted in FIGS. 1-4 above. The example of FIG. 5 includes a driver sub-circuit that is an example of circuit 300, described above in relation to FIG. 3 and of the driver circuit for Mpp 204, described above in relation to FIG. 2A.

System 500 includes regulation loop 510, buffer 516 and output buffer 555, which is depicted as a CMOS inverter. Buffer 516 and output buffer 555 receive control signals from switching logic 512 to alternately connect the voltage from regulated node 530 to the gate of Mpp 504 (via buffer 516) and Vsupply 540 to the gate of Mpp 504 (via buffer 555).

Buffer 516 may be configured as paired source followers with switched power supply connections. The arrangement of buffer 516 shown in FIG. 5 may provide an advantage over other circuit arrangements by providing a low output impedance connection to the gate of Mpp 504, and therefore fast switching, as well as accurately applying the voltage from node 530 to the gate of Mpp 504, e.g., with little voltage drop. Buffer 516 includes four transistors in series between Vsupply 540 and Vss 543. The drain-source channel of PMOS transistor P5 538 connects Vsupply 540 to the drain-source channel of NMOS transistor N5 541, which in turn connects to the drain-source channel of PMOS transistor P6 542, which in turn connects to Vss 543 through the drain-source channel of NMOS transistor 544.

Transistor N5 541 is arranged as a source follower and transistor P6 542 is also a source follower, such that buffer 516 applies, or blocks, the regulated voltage at node 530 from regulation loop 510 to the gate of Mpp 504 based on the control signals from switching logic 512. Switching logic 512 connects to the gate of P5 538 and through inverter 548 to the gate of N6 544. In this manner, switching logic may enable buffer 516 to apply the regulated voltage to the gate of Mpp 504 by connecting and disconnecting the source follower circuits to and from the selected power supply rail. In other words, buffer 516 includes a PMOS source follower and an NMOS source follower. The output of buffer 516 switches ON and OFF based on alternately connecting the PMOS source follower and the NMOS source follower to one of Vsupply 540 or to a reference voltage for the circuit, e.g., Vss 543.

Output buffer 555 and regulation loop 510 may operate in the same manner as described above in relation to FIGS. 2, 3 and 4. Output buffer 555 includes PMOS transistor P0 550 which connects Vsupply 540 through the drain-source channel of P0 550 to the drain-source channel of NMOS transistor M0 552, which in turn connects to reference node Vss 543. Switching logic 512 connects to both gates of P0 550 and M0 555 with the same control signal line. Buffer 555 applies supply voltage 540 to the gate of Mpp 504.

Regulation loop 510 includes replica transistor Mpr 592. The drain source channel of replica transistor Mpr 592 connects Vsupply 540 to the drain source channel of NMOS transistor N8 564, which in turn connects to circuit ground through the drain source channel of NMOS transistor N10 566. Transistors N8 564 and N10 566 are both diode connected. The gate of NMOS transistor N9 562 connects to the gate of N10 566 and the gate of NMOS transistor N7 560 connects to the gate of N8 564. The drain source channel of N9 562 current ground to the drain-source N7 560, which in turn connects to the drain-source channel of PMOS transistor P3 534.

Drain-source channel for PMOS transistor P2 532 connects Vsupply 540 to NMOS transistor N2 528, which connects to the drain source channel of PMOS transistor P4 526. Resistor R1 568 connects the drain source channel of P4 526 to the drain source channel of NMOS transistor N4 570, which connects to circuit ground through current source Itrimmed 542. P3 534 is diode connected and the gate of P3 534 connects to the gate of P2 532. N2 528 is diode connected and the gate of N2 528 connects to N5 541 as well as to Vsupply 540 through capacitor C3 536. The gate of replica transistor Mpr 592 connects to Vsupply 540 through capacitor C2 524 and also connects to the node between N2 528 and P4 526, e.g., this is regulated node 530. P4 526 is diode connected, and the gate of P4 526 connects to P6 542, as well as to Vsupply 540 through capacitor C1 522 and to the anode of diode D1 520. The cathode of D1 520 connects to Vsupply 540. Vsupply 541 connects to the gate of N4 570. In some examples, Vsupply 541 may be a different voltage supply than Vsupply 540. In other examples, Vsupply 541 may be set to the same voltage as Vsupply 540.

The circuit arrangement and component selection mean that the output current, Iout-source 505 is proportional to the trimmed current, Itrimmed 542. In regulation loop 510, replica transistor Mpr 592 is proportional to power transistor Mpp 504, as described above in relation to FIG. 2A. Also the current through P2 532, I3 is the same as Itrimmed 542, I1 is proportional to I3, and I1 is also proportional to I2.

Figure 6:
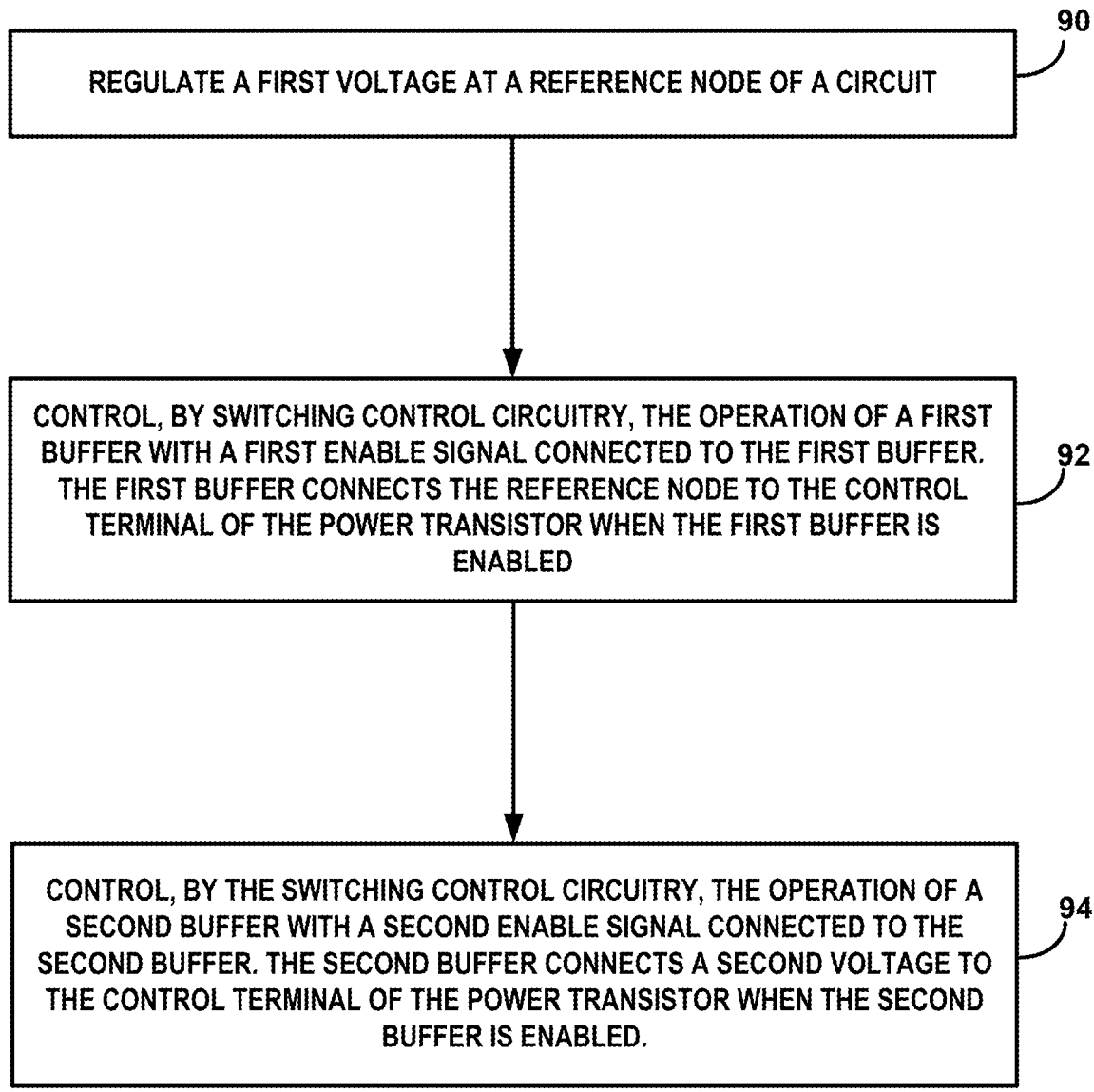
FIG. 6 is a flow chart illustrating an example operation of a system for slew rate control of a power transistor.

FIG. 6 is a flow chart illustrating an example operation of a system for slew rate control of a power transistor. Some example implementations for a system of this disclosure include systems 100, 200, 400 and 500 described above. The blocks of FIG. 6 will be described in terms of system 200 of FIG. 2A, unless otherwise noted.

Regulation loop 257 may set and maintain, e.g., regulate, a first voltage at a reference node 230 of a drive circuit for power transistor Mpp 204 (90), where regulation loop 257 includes transistor Mpr 292, configured as a replica of power transistor Mpp 204.

Switching control circuitry, e.g., switching logic 212, may control the operation of buffer 216 with a first enable signal connected to buffer 216 (92). When enabled, e.g., when switched ON, buffer 216 connects reference node 230 to the gate of power transistor Mpp 204. In other words, when buffer 216 receives an enable signal from switching logic 212, buffer 216 applies the voltages at regulated node 230 to the gate of Mpp 204.

Switching logic 212 may further control the operation of output buffer 255 with a second enable signal connected to output buffer 255. Output buffer 255 is configured to connect the supply voltage, Vsupply 240, to the gate of power transistor Mpp 204 when the output buffer 255 is enabled.

In one or more examples, the functions described above may be implemented in hardware, software, firmware, or any combination thereof. For example, the switching logic 112 may be implemented in hardware, software, firmware, or any combination thereof. If implemented in software, the functions may be stored on a tangible computer-readable storage medium and executed by a processor or hardware-based processing unit.

Instructions may be executed by one or more processors, such as one or more digital signal processors (DSPs), general purpose microprocessors, application specific integrated circuit (ASIC), Field programmable gate array (FPGAs), or other equivalent integrated or discrete logic circuitry. Accordingly, the terms "control circuitry," "controller," "processor," and "processing circuitry" as used herein, such as may refer to any of the foregoing structure or any other structure suitable for implementation of the techniques described herein. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described The techniques of this disclosure may also be described in the following clauses.

Clause 1: A circuit configured to drive a control terminal of a power semiconductor comprising: a replica semiconductor comprising a replica of the power semiconductor; a regulation loop configured to set and maintain a first voltage at a regulated node, wherein the regulation loop includes the replica semiconductor; a first buffer configured to apply the first voltage from the regulated node to the control terminal of the power semiconductor while the first buffer is switched ON; and a second buffer configured to apply a second voltage to the control terminal while the first buffer is switched OFF.

Clause 2: The circuit of clause 1, wherein the replica semiconductor and the power semiconductor each comprise a transistor, wherein the replica transistor comprises: a replica area that is proportional to an area of the power transistor, the replica transistor and the power transistor are of a same type; and the replica transistor and the power transistor were fabricated on a same substrate under same conditions.

Clause 3: The circuit of any of clauses 1 and 2, wherein the second voltage is the supply voltage for the circuit.

Clause 4: The circuit of any of clauses 1 through 3, wherein the regulation loop comprises a current mirror.

Clause 5: The circuit of any of clauses 1 through 4, wherein the regulation loop comprises a first element that defines a first impedance and a second element that defines a second impedance, wherein the first element connects to a supply voltage in parallel to the second element, and wherein the first impedance is configured to match the second impedance.

Clause 6: The circuit of clause 5, further comprising a trimmed current source connected in series with the first element that defined the first impedance.

Clause 7: The circuit of any of clauses 5 and 6, further comprises a non-inverting input of the error amplifier connects to the first element, and an inverting input of the error amplifier connects to the second element.

Clause 8: The circuit of any of clauses 1 through 7, wherein the first buffer comprises: a PMOS source follower; and an NMOS source follower; and wherein the output of the first buffer switches ON and OFF based on alternately connecting the PMOS source follower and the NMOS source follower to one of: a supply voltage for the circuit; or a reference voltage for the circuit.

Clause 9: A system comprising: a power transistor that includes a control terminal, a circuit configured to drive operation of the power transistor, the circuit comprising: a replica transistor configured as a replica of the power transistor; a regulation loop configured to set and maintain a first voltage at a regulated node, wherein the regulation loop comprises the transistor; a first buffer configured to apply the first voltage from the regulated node to the control terminal of the power transistor while the first buffer is switched ON; and a second buffer configured to apply a second voltage to the control terminal while the first buffer is switched OFF; and control circuitry configured to manage the operation of the system.

Clause 10: The system of clause 9, wherein the power transistor is a first power transistor and the circuit is a first circuit, the system further comprising a second power transistor; and a second circuit configured to drive operation of the second power transistor, the second circuit comprising a second replica transistor configured as a replica of the second power transistor; a regulation loop configured to set and maintain a third voltage at a regulated node of the second circuit, wherein the regulation loop comprises the second transistor; a third buffer configured to apply the third voltage from the regulated node of the second circuit to the control terminal of the second power transistor while the third buffer is switched ON; and a fourth buffer configured to apply a fourth voltage to the control terminal of the second power transistor while the third buffer is switched OFF; and wherein the control circuitry is configured to manage the operation of the first circuit and the second circuit of the system.

Clause 11: The system of clause 10, further comprising a third circuit configured to drive the operation of the first power transistor the third circuit comprising a fifth buffer configured to apply the voltage from a regulated node of the third circuit to the control terminal of the first power transistor, wherein the control circuitry is configured to generate a voltage profile to turn on the first power transistor by alternately enabling and disabling the first buffer and the fifth buffer.

Clause 12: The system of any of clauses 10 and 11, wherein the control circuitry is configured to generate a voltage profile to turn on the second power transistor by alternately enabling and disabling the third buffer, wherein to enable the third buffer comprises to switch ON the third buffer.

Clause 13: The system of any of clauses 10 through 12, wherein an output terminal of the first power transistor connects to an output terminal of the second power transistor and to a control terminal of a power switch.

Clause 14: The system of any of clauses 9 through 13, wherein the second voltage is the supply voltage for the circuit.

Clause 15: The system of any of clauses 8 through 14, wherein the regulation loop comprises a first impedance and a second impedance, wherein the first impedance connects to a supply voltage in parallel to the second impedance, and wherein the first impedance is configured to match the second impedance.

Clause 16: The system of clause 15, further comprising a trimmed current source connected in series with the first impedance.

Clause 17: The system of any of clauses 15 and 16, further comprising a non-inverting input of the error amplifier connects to the first impedance, and an inverting input of the error amplifier connects to the second impedance.

Clause 18: A method comprising regulating a first voltage at a reference node of a circuit, wherein the circuit is configured to drive operation of a power transistor, wherein the power transistor comprises a control terminal, wherein a regulation loop of the circuit is configured set and maintain the first voltage at the reference node, and wherein the regulation loop comprises a transistor configured as a replica of the power transistor; controlling, by switching control circuitry, the operation of a first buffer with a first enable signal connected to the first buffer, wherein the first buffer connects the reference node to the control terminal of the power transistor when the first buffer is enabled; controlling, by the switching control circuitry, the operation of a second buffer with a second enable signal connected to the second buffer, wherein the second buffer connects a second voltage to the control terminal of the power transistor when the second buffer is enabled; in response to receiving the first enable signal at the first buffer, applying the voltage of the reference node to the control terminal of the power transistor.

Clause 19: The method of clause 18, wherein the reference node is a first reference node, the method further comprising generating, by the switching control circuitry, a gate-profile waveform at the control terminal of the power transistor, wherein generating the gate-profile waveform comprises: enabling, by the switching control circuitry, the first buffer for a first duration; enabling, by the switching control circuitry, a third buffer for a second duration separate from the first duration, wherein enabling the third buffer applies a voltage at a second reference node to the control terminal of the power transistor.

Clause 20: The method of any of clauses 18 and 19: wherein the regulation loop comprises a first element that defines a first impedance and a second element that defines a second impedance, wherein the first element connects to a supply voltage in parallel to the second element, wherein the first impedance is configured to match the second impedance, and wherein a trimmed current source connects in series with the first element.

Various examples of the disclosure have been described. These and other examples are within the scope of the following claims.

What is claimed is:

1. A circuit configured to drive a control terminal of a power semiconductor, the circuit comprising:
a replica semiconductor comprising a replica of the power semiconductor, wherein the replica semiconductor is of the same type as the power semiconductor and wherein the replica semiconductor and the power semiconductor were fabricated on a same substrate under same conditions;
a regulation loop configured to set and maintain a first voltage at a regulated node, wherein the regulation loop includes the replica semiconductor;
a first buffer configured to apply the first voltage from the regulated node to the control terminal of the power semiconductor while the first buffer is switched ON;
a second buffer configured to apply a second voltage to the control terminal while the first buffer is switched OFF; and
switching control circuitry configured to generate a gate-profile waveform at the control terminal of the power transistor, wherein generating the gate-profile waveform comprises:
enabling, by the switching control circuitry, the first buffer for a first duration; and
enabling, by the switching control circuitry, a third buffer for a second duration separate from the first duration, wherein enabling the third buffer applies a voltage at a second reference node to the control terminal of the power transistor.

2. The circuit of claim 1,
wherein the replica semiconductor and the power semiconductor each comprise a transistor, wherein the replica transistor comprises a replica area that is proportional to an area of the power transistor.

3. The circuit of claim 1, wherein the second voltage is a supply voltage for the circuit.

4. The circuit of claim 1,
wherein the first buffer and the second buffer are each configured to receive a respective enable signal from control circuitry, and
wherein the respective enable signal controls when the first buffer and the second buffer are switched ON and switched OFF.

5. The circuit of claim 1,
wherein the regulation loop comprises a first element that defines a first impedance and a second element that defines a second impedance,
wherein the first element connects to a supply voltage in parallel to the second element, and
wherein the first impedance is configured to match the second impedance.

6. The circuit of claim 5, further comprising a trimmed current source connected in series with the first element that defined the first impedance.

7. The circuit of claim 5, further comprising an operational amplifier configured as an error amplifier, wherein:
a non-inverting input of the error amplifier connects to the first element, and
an inverting input of the error amplifier connects to the second element.

8. The circuit of claim 1,
wherein the first buffer comprises:
a PMOS source follower; and
an NMOS source follower; and
wherein the first buffer switches ON and OFF based on alternately connecting the PMOS source follower and the NMOS source follower to one of:
a supply voltage for the circuit; or
a reference voltage for the circuit.

9. A system comprising:
a first power transistor comprising a control terminal;
a circuit configured to drive operation of the first power transistor, the circuit comprising:

a replica transistor configured as a replica of the first power transistor, wherein the replica semiconductor is of the same type as the first power semiconductor and wherein the replica semiconductor and the first power semiconductor were fabricated on a same substrate under same conditions;

a first regulation loop configured to set and maintain a first voltage at a regulated node, wherein the regulation loop comprises the replica transistor;

a first buffer configured to apply the first voltage from the regulated node to the control terminal of the first power transistor while the first buffer is switched ON; and a second buffer configured to apply a second voltage to the control terminal while the first buffer is switched OFF;

a second power transistor; and a second circuit configured to drive operation of the second power transistor, the second circuit comprising:
a second replica transistor configured as a replica of the second power transistor;
a second regulation loop configured to set and maintain a third voltage at a regulated node of the second circuit, wherein the regulation loop comprises the second transistor;
a third buffer configured to apply the third voltage from the regulated node of the second circuit to the control terminal of the second power transistor while the third buffer is switched ON; and
a fourth buffer configured to apply a fourth voltage to the control terminal of the second power transistor while the third buffer is switched OFF; and control circuitry configured to manage the operation of the system.

10. The system of claim 9,
further comprising a third circuit configured to drive the operation of the first power transistor the third circuit comprising a fifth buffer configured to apply a third voltage from a regulated node of the third circuit to the control terminal of the first power transistor,
wherein the control circuitry is configured to generate a voltage profile to turn on the first power transistor by alternately enabling and disabling the first buffer and the fifth buffer.

11. The system of claim 9,
wherein the control circuitry is configured to generate a voltage profile to turn on the second power transistor by alternately enabling and disabling the third buffer, and
wherein to enable the third buffer comprises to switch ON the third buffer.

12. The system of claim 9, wherein an output terminal of the first power transistor connects to an output terminal of the second power transistor and to a control terminal of a power switch.

13. The system of claim 9, wherein the second voltage is the supply voltage for the circuit.

14. The system of claim 8,
wherein the regulation loop comprises a first impedance and a second impedance,
wherein the first impedance connects to a supply voltage in parallel to the second impedance, and
wherein the first impedance is configured to match the second impedance.

15. The system of claim 14, further comprising a trimmed current source connected in series with the first impedance.

16. The system of claim 14, further comprising an operational amplifier configured as an error amplifier, wherein:
a non-inverting input of the error amplifier connects to the first impedance, and
an inverting input of the error amplifier connects to the second impedance.

17. A method comprising:
regulating a first voltage at a first reference node of a circuit,
wherein the circuit is configured to drive operation of a power transistor,
wherein the power transistor comprises a control terminal,
wherein a regulation loop of the circuit is configured set and maintain the first voltage at the first reference node, and
wherein the regulation loop comprises a transistor configured as a replica of the power transistor, wherein the replica semiconductor is of the same type as the power semiconductor and wherein the replica semiconductor and the power semiconductor were fabricated on a same substrate under same conditions;

controlling, by switching control circuitry, the operation of a first buffer with a first enable signal connected to the first buffer, wherein the first buffer connects the first reference node to the control terminal of the power transistor when the first buffer is enabled;

controlling, by the switching control circuitry, the operation of a second buffer with a second enable signal connected to the second buffer, wherein the second buffer connects a second voltage to the control terminal of the power transistor when the second buffer is enabled;

in response to receiving the first enable signal at the first buffer, applying the voltage of the reference node to the control terminal of the power transistor; and generating, by the switching control circuitry, a gate-profile waveform at the control terminal of the power transistor, wherein generating the gate-profile waveform comprises:
enabling, by the switching control circuitry, the first buffer for a first duration; and
enabling, by the switching control circuitry, a third buffer for a second duration separate from the first duration, wherein enabling the third buffer applies a voltage at a second reference node to the control terminal of the power transistor.

18. The method of claim 17:
wherein the regulation loop comprises a first element that defines a first impedance and a second element that defines a second impedance,
wherein the first element connects to a supply voltage in parallel to the second element,
wherein the first impedance is configured to match the second impedance, and wherein a trimmed current source connects in series with the first element.

* * * * *